United States Patent [19]
Johnson

[11] 3,976,511

[45] Aug. 24, 1976

[54] METHOD FOR FABRICATING INTEGRATED CIRCUIT STRUCTURES WITH FULL DIELECTRIC ISOLATION BY ION BOMBARDMENT

[75] Inventor: William Stanford Johnson, Hopewell Junction, N.Y.

[73] Assignee: IBM Corporation, Armonk, N.Y.

[22] Filed: June 30, 1975

[21] Appl. No.: 592,151

[52] U.S. Cl. ............................ 148/1.5; 148/187; 156/17; 357/49; 427/86
[51] Int. Cl.² ............................ H01L 21/263
[58] Field of Search .............. 148/1.5, 187, 175; 156/17; 357/49; 427/82, 86

[56] References Cited
UNITED STATES PATENTS

| | | | |
|---|---|---|---|
| 3,445,926 | 5/1969 | Medved et al. | 148/1.5 X |
| 3,479,237 | 11/1969 | Bergh et al. | 148/1.5 X |
| 3,537,921 | 11/1970 | Boland | 148/187 |
| 3,575,745 | 4/1971 | Hill | 148/1.5 X |
| 3,589,949 | 6/1971 | Nelson | 148/1.5 |
| 3,615,875 | 10/1971 | Morita et al. | 148/1.5 |
| 3,622,382 | 11/1971 | Brack et al. | 148/1.5 X |
| 3,635,774 | 1/1972 | Ohta | 148/187 X |
| 3,736,192 | 5/1973 | Tokuyama et al. | 148/1.5 |
| 3,738,883 | 6/1973 | Bean et al. | 148/187 X |
| 3,767,972 | 10/1973 | MacRae et al. | 148/1.5 X |
| 3,772,102 | 11/1973 | Tiemann et al. | 148/189 X |
| 3,783,047 | 1/1974 | Paffen et al. | 148/187 |
| 3,788,913 | 1/1974 | Ono et al. | 156/17 X |
| 3,826,699 | 7/1974 | Sawazaki et al. | 148/175 |
| 3,840,412 | 10/1974 | Davidsohn et al. | 148/175 |
| 3,850,707 | 11/1974 | Bestland | 148/175 |
| 3,858,237 | 12/1974 | Sawazaki et al. | 357/49 |

*Primary Examiner*—L. Dewayne Rutledge
*Assistant Examiner*—J. M. Davis
*Attorney, Agent, or Firm*—J. B. Kraft

[57] ABSTRACT

An integrated circuit structure with full dielectric isolation, i.e., the electrical isolation is provided by electrically insulative material, is formed by ion bombarding a silicon substrate with ions such as nitrogen, oxygen or carbon to implant subsurface region containing such ions and heating the resulted bombarded substrate to a temperature sufficient to react the introduced ions with the substrate to form a subsurface layer which has a different etchability than silicon. An epitaxial layer of monocrystalline silicon is then deposited on the substrate, after which a pattern of regions of electrically insulating material is formed extending through the epitaxial layer beyond the substrate surface into contact with the subsurface layer to laterally surround a plurality of pockets in said silicon. An electrically insulative layer is formed on the surface of the epitaxial layer continuous with the electrically insulating lateral regions. The silicon substrate below the subsurface layer is removed by etching in a solvent in which silicon is more etchable than is the subsurface layer to expose the subsurface layer, and the subsurface layer is etched away with a solvent in which this layer is more etchable than are the lateral regions of electrically insulating material. As a result, the planar surfaces of the silicon pockets are exposed, and selective conductivity-determining impurities may be introduced into the silicon pockets to form the devices of the integrated circuit.

21 Claims, 11 Drawing Figures

METHOD FOR FABRICATING INTEGRATED CIRCUIT STRUCTURES WITH FULL DIELECTRIC ISOLATION BY ION BOMBARDMENT

BACKGROUND OF THE INVENTION

The present invention relates to integrated circuit structures and, more particularly, to dielectric isolation, i.e., isolation with electrically insulative materials in integrated circuit structures.

The form of most existing integrated circuits is the so-called monolithic form. Such a structure contains great numbers of active and passive devices in a block or monolith of semiconductor material. Electrical connections between these active and passive devices are generally made on a surface of the semiconductor block of material. Until the present, junction isolation has been by far the most widely practiced manner of isolating devices or circuits in the integrated circuit from each other. For example, active P-type diffusions are customarily used to isolate conventional and P-N bipolar devices from one another and from other devices such as the resistors and capacitors. Such junction isolation is also used in integrated circuits utilizing field effect transistor devices. More detailed descriptions of junction isolation may be found in U.S. Pat. Nos. 3,319,311; 3,451,866; 3,508,209 and 3,539,876.

Although junction isolation has provided excellent electrical isolation in integrated circuits which have functioned very effectively over the years, at the present stage of the development of the integrated circuit art, there is an increasing demand in the field of digital integrated circuits for faster switching circuits. It has long been recognized that the capacitive effect of the isolating P-N junctions has a slowing effect on the switching speed of the integrated circuits. Up to now, the switching demands of the integrated circuits have been of a sufficiently low frequency that the capacitive effect in junction isolation has presented no major problems. However, with the higher frequency switching demand which can be expected in the field in the future, the capacitive effect produced by junction isolation may be an increasing problem. In addition, junction isolation requires relatively low device densities which is contrary to higher device densities required in large scale integration. Junction isolation also tends to give rise to parasitic transistor effects between the isolation region and its two abutting regions. Consequently, in recent years there has been a revival of interest in integrated circuits having dielectric isolation instead of junction isolation. In such dielectrically isolated circuits, the semiconductor devices are isolated from each other by insulative dielectric materials.

Conventionally, such dielectric isolation in integrated circuits has been formed by etching channels in a semiconductor member corresponding to the isolation regions. Usually a composite of a thin dielectric layer forming the interface with the semiconductor member covered by a thicker layer of polycrystalline silicon is deposited. Then, the other surface of the semiconductor member is either mechanically ground down or chemically etched until the bottom portions of the previously etched channels are reached. This leaves the structure wherein a plurality of pockets of semiconductor material surrounded by the dielectric layer are supported on the polycrystalline silicon substrate and separated from each other by extensions or fingers of the polycrystalline substrate. Such structures have been described in the prior art in patents such as U.S. Pat. Nos. 3,391,023; 3,332,137; 3,419,956; 3,372,063; 3,575,740; 3,421,205; 3,423,258; 3,423,255 and 3,478,418.

Complete dielectric isolation, as set forth in the prior art presented by the referenced patents, has had several shortcomings which have prevented it from being fully successful in high speed circuitry where it was particularly needed. Such high speed circuitry requires particularly shallow devices. Thus, the semiconductor pockets were required to be in the order of 0.1 mil thickness. However, because of wafer handling requirements in semiconductor integrated circuit fabrication techniques, the substrates which had to be etched or ground down were in the order of 6 to 8 mils in thickness. In practicing this prior art, fabricators experienced considerable difficulty in grinding, lapping or etching from 6 to 8 mils of material through a substrate with no inaccuracies which would affect the 0.1 mil pockets.

Recent work in the art has offered solutions to the problem of removal of the major portion of the semiconductor member to leave the semiconductor pockets. In accordance with the publication "Application of Preferential Electrochemical Etching of Silicon to Semiconductor Device Technology", M. Theunissen et al., *Journal of the Electrochemical Society*, July 1970, pp. 959–965, selective anodic electrochemical etching may be used to remove and, thereby, cleanly and accurately separate the major portion of the semiconductor member from the semiconductor pockets in which the devices are to be formed. Copending application Ser. No. 340,150, Magdo et al., filed Mar. 12, 1973, U.S. Pat. No. 3,944,447, presents a related solution to this problem.

The present invention provides a different approach to this problem which avoids the necessity of utilizing the anodic electrochemical etch differentials between differently doped regions of semiconductor material in the removal of the major portion of the semiconductor member.

In order to form an integrated circuit structure with full dielectric isolation, the present invention uses ion bombardment. U.S. Pat. No. 3,622,382 and the publication "Epitaxial Silicon Layers Grown on Ion Implanted Silicon Layers", R. J. Dexter et al., *Applied Physics Letters*, Vol. 23, No. 8, Oct. 15, 1973, pp. 455–457, described techniques for forming dielectrically isolated integrated circuits by the introduction into a silicon substrate of reactive impurities such as nitrogen, oxygen and carbon, and heating the same for a time sufficient to react such impurities with silicon to form a buried or subsurface layer of dielectric or insulative material while the silicon above this buried layer remains substantially monocrystalline. The publication further discloses that by implanting nitrogen a buried dielectric silicon nitride region may be formed slightly below the silicon surface without affecting the substantially monocrystalline nature of the silicon material above this buried region even to the extent that a monocrystalline epitaxial silicon layer may be formed about this surface. In accordance with the techniques described in this prior art, lateral dielectric isolation may be similarly achieved by forming dielectric regions of the same composition by ion bombardment extending from the buried regions to the surface of either the silicon substrate or the silicon epitaxial layer. In such structures, the buried region serves as part of the final dielectric isolation in the integrated circuit.

While the techniques described for forming such buried dielectric isolation are useful for many purposes, utilization for integrated circuits having very strict vertical tolerances is limited because it is difficult to consistently control the thickness of the dielectric material forming the buried region, the uniformity of the dielectric material within the buried region or the quality of the interface between the dielectric material and the silicon. This is particularly true when the techniques are utilized to form relatively thick dielectric regions in the order of at least one micron which would be desirable because of the relatively low parasitic capacitances in the resulting integrated circuits.

SUMMARY OF THE INVENTION

Accordingly, it is an object of the present invention to provide a method of forming an integrated circuit with full dielectric isolation in which the initial semiconductor substrate is easily, effectively and cleanly removed.

It is another object of the present invention to provide a method of forming an integrated circuit with full dielectric isolation which avoids the need for grinding or lapping in removing the initial semiconductor substrate.

It is yet another object of the present invention to provide a method for forming an integrated circuit with full dielectric isolation which does not rely on the differential anodic etch characteristics of differently doped semiconductor materials in removing the initial semiconductor substrate.

It is a further object of the present invention to provide a method for forming such full dielectric isolation of thermally grown silicon dioxide.

In accordance with the present invention, an integrated circuit structure with full dielectric isolation, i.e., devices in the circuit are isolated by substantially only electrically insulative material, is formed by an ion bombardment method comprising first forming a subsurface layer which has a different etchability than the semiconductor substrate in a monocrystalline semiconductor substrate by bombarding a surface of the substrate with ions of at least one element selected from the group consisting of nitrogen, oxygen, and carbon, and maintaining the bombardment for a time sufficient to produce an ion concentration of at least $10^{19}$ ions/cm$^3$ and at an energy level sufficient to result in ion penetration to the selected depth below said surface which remains monocrystalline semiconductor material. Then the resultant bombarded substrate is heated to a temperature sufficient to react the introduced ions with the substrate to thereby form a subsurface layer of insulative material, e.g., silicon nitride, silicon dioxide or silicon carbide.

Next, a layer of the same semiconductive material as the substrate is deposited on the substrate. Since the surface portion of the substrate is substantially unaffected by the previous ion bombardment and remains substantially monocrystalline, the epitaxial layer deposited thereon will also be monocrystalline.

Next, a pattern of regions of electrically insulative material extending through the epitaxial layer and beyond the supporting substrate surface into contact with the subsurface layer is formed to laterally surround a plurality of pockets of the semiconductor material; the electrically insulating material is preferably selected so that the subsurface layer is more etchable in the selected solvent than is the insulating material. Also, a layer of electrically insulative material is formed on the surface of the epitaxial layer continuous with these electrically insulating regions.

Then, e.g., by the use of suitable etchants in which the subsurface layer is more etchable than is the semiconductor, the semiconductor substrate below the subsurface layer is removed to expose the subsurface layer and, then, the subsurface layer is etched away with the solvent in which the subsurface is more etchable than are the regions of electrically insulating material formed through the epitaxial layer. As a result, the planar surfaces of semiconductor pockets are exposed, and are thus available for the subsequent introduction of selected conductivity-determining impurities to form the active and passive integrated circuit device regions. Then, a layer of electrically insulating material may be deposited over the pockets to provide an integrated circuit structure with full dielectric isolation.

Alternatively, the layer of electrically insulative material may be formed on the surface of the epitaxial layer prior to the formation of the pattern of regions of electrically insulative material which provide the lateral dielectric isolation. In this approach, both the semiconductor substrate below the subsurface layer and the subsurface layer itself are removed before the formation of the pattern of lateral regions of electrically insulative material.

In this procedure, the pattern of regions of electrically insulative material may then be formed extending from the silicon surface exposed by the removal of the subsurface layer, through the epitaxial layer into contact with the layer of electrically insulative material.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1A:
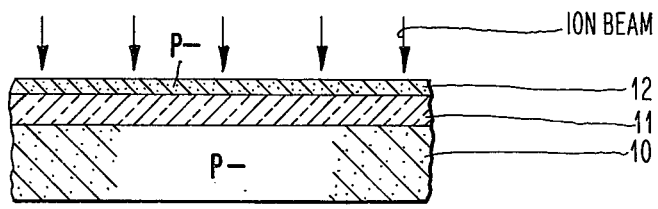
FIGS. 1A–1F show diagrammatic sectional views of a portion of an integrated circuit in order to illustrate the method of the present invention.

Commencing with a silicon substrate of P-conductivity-type having a conductivity-determining impurity or dopant concentration in the order of $2 \times 10^{16}$ atoms/cm$^3$ or less, shown in FIG. 1A as substrate 10, a buried or subsurface electrically insulating layer 11 of silicon nitride is formed utilizing the ion bombardment and heating techniques described in U.S. Pat. No. 3,622,382 and in the previously mentioned R. G. Dexter et al. publication appearing in

*Applied Physics Letters*, Oct. 14, 1973, pp. 455–457. Because of the extensive details given in this prior art, a description of the formation of silicon nitride layer 11 will be limited. Utilizing conventional ion implantation equipment such as those described in U.S. Pat. No. 3,756,862, the bombardment with nitrogen ions at a dosage of about $10^{16}$ /cm$^2$ is carried out at room temperature at an energy level of about 150 Kev at an angle of about 7° to the <100> using a $^{14}$N ion beam.

The substrate is then annealed at a temperature of about 1200° C for 1 hour. The resulting structure shown in FIG. 1A has a silicon nitride layer 11 about 0.4 microns in thickness and a substantially undamaged surface portion of monocrystalline silicon 12 about 0.2 microns in thickness.

Figure 1B:
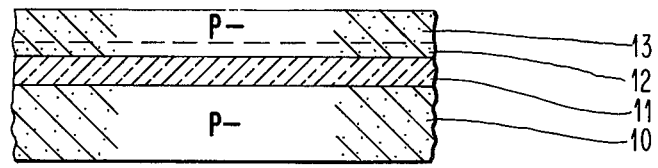

Then, FIG. 1B, a monocrystalline epitaxial layer of silicon 13 is deposited on the surface of silicon substrate portion 12 by conventional epitaxial deposition techniques. Epitaxial layer 13 has a P-type impurity concentration in the order of $1 \times 10^{15}$ atoms/cm$^3$ and a thickness of 1 micron.

Figure 1C:
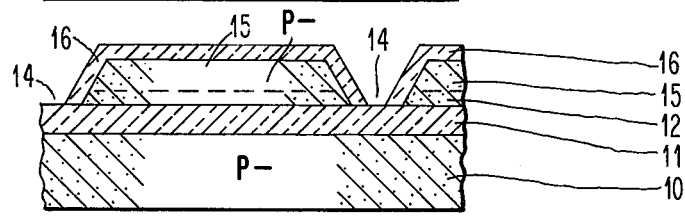
Figure 1D:
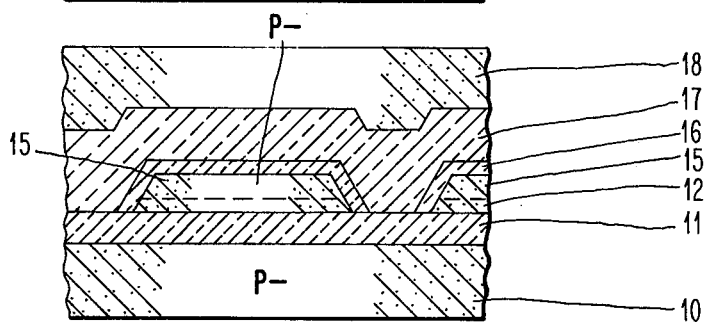

With reference to FIGS. 1C and 1D, the formation of the lateral dielectric isolation will be described. Utilizing conventional integrated circuit photolithographic selective etching techniques, the pattern of apertures 14 are etched through epitaxial layer 13 and substrate portion down to buried silicon nitride layer 11. The resulting structure contains a plurality of isolated monocrystalline silicon pockets 15. The lateral dielectric isolation may now be conveniently formed by first conducting a conventional thermal oxidation with temperatures in the order of 950°–1100° C to form a layer of thermal silicon dioxide 16 about 1000 A in thickness. Then, utilizing conventional chemical vapor deposition, or even RF sputter deposition techniques, a layer of dielectric or electrically insulative material such as silicon dioxide 17, FIG. 1D, or aluminum oxide having oxide having a thickness in the order of 1 micron is deposited.

Next, utilizing the previously mentioned epitaxial deposition techniques, a deposition is carried out to deposit a layer of silicon 18 which will serve as an integrated circuit supporting layer. Layer 18 is in the order of from 2–15 mils in thickness depending on the wafer size, e.g., for a 2¼-inch wafer, a thickness of from 8–10 mils is preferable. Because layer 17 is a dielectric material, layer 18 will be polycrystalline silicon.

While the combination of dielectric layers 16 and 17 are continuous with each other to provide both the lateral and horizontal dielectric isolation surrounding monocrystalline silicon pockets 15, it will be understood that such lateral and horizontal dielectric isolation may be formed by other techniques. For example, the lateral dielectric isolation pattern through the epitaxial layer may be formed by conventional recessed silicon dioxide techniques through the expedient of first selectively etching a pattern of recesses in the epitaxial layer, and then thermally oxidizing the silicon remaining in the recesses utilizing appropriate oxidation blocking masks, e.g., silicon nitride masks, to form recessed or inset regions of silicon dioxide extending through the epitaxial layer. Representative of prior art teaching of these recessed oxide techniques are U.S. Pat. No. 3,648,125 and an article entitled, "LOCOS Devices", E. Kooi et al., Philips Research Report, pp. 166–180 (1971). Such recessed silicon dioxide insets will provide the lateral dielectric isolation, and in a subsequently deposited dielectric layer will provide the horizontal dielectric isolation. In such a structure, a polycrystalline silicon supporting layer may be formed as previously described.

Figure 1E:
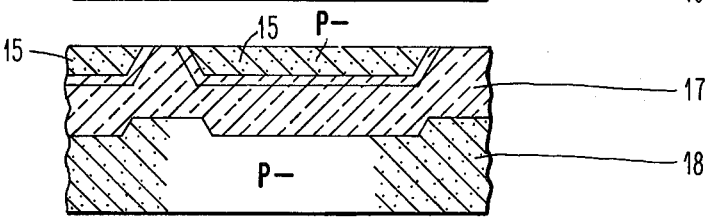

Next, silicon substrate 10 is removed by etching during which process polycrystalline silicon layer 18 is masked to prevent its removal. Any conventional etchant for silicon such as a composition of nitric acid and diluted hydrofluoric acid may be utilized in etching away silicon substrate 10 while silicon nitride layer 11 which is substantially resistant to such an etchant serves as an etch barrier. Then, utilizing a suitable conventional etchant for the silicon nitride such as hot phosphoric acid or hot phosphoric salt, silicon nitride layer 11 is etched away to leave the structure shown in FIG. 1E which has been inverted so that polycrystalline silicon support 18 is at the bottom of the structure. In this connection, it should be noted that both the silicon dioxide regions 17 and the silicon pockets 15 are relatively resistant to the silicon nitride etchants to leave the substantially planar structure shown in FIG. 1E.

Figure 1F:
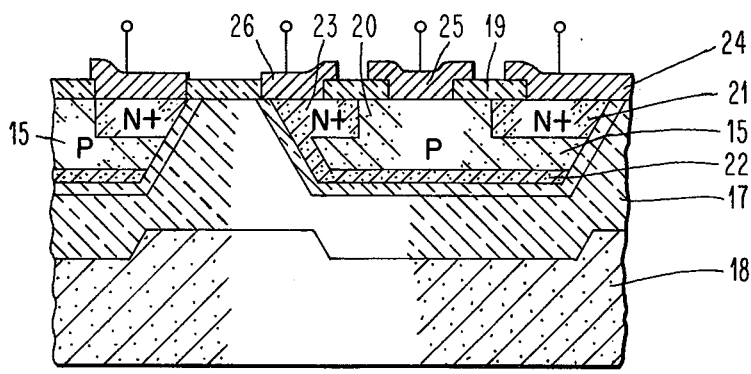

Next, as shown in an enlarged view in FIG. 1F, a layer of electrically insulative material such as silicon dioxide 19 is formed on the surface of the structure in the conventional manner to complete full dielectric isolation, and the processing of the integrated circuit is then completed to produce the structure shown by conventional integrated circuit fabrication techniques, e.g., those described in U.S. Pat. No. 3,539,876. In the final structure, we have a P-type base region 20, an N+ emitter 21, an N-type collector 22, an N+ contact diffusion 23, and metallic contacts 24, 25 and 26, respectively made to the emitter, base and collector regions in the structure.

Another significant advantage of the method of the present invention is that if desired, it permits the utilization in silicon pockets 15 of only the epitaxially deposited silicon. Thus, the devices of the integrated circuit are formed in silicon which has not been subjected to ion bombardment. Although conventional annealing techniques substantially minimize the affects of ion bombardment on the silicon through which the ions pass in reaching their predetermined penetration depth, for some purposes, it may be desired to utilize silicon which has not been subjected to ion bombardment.

Normally, in the present process, silicon pockets 15 will have their surface portion made up of substrate surface layer 12 which has been subjected to ion bombardment. This occurs because during the formation of the lateral electrical isolation pattern of layer 17, apertures are etched through to silicon nitride layer 11. However, substrate layer 12 may be eliminated from pockets 15 by suitable etch-down techniques. For example, after the removal of silicon nitride layer 11, as described above, the surface of silicon pockets 15 may be subjected to a conventional etchant for silicon of the type set forth above for a period of time sufficient to remove layer 12. In such a case, since the etchant for the silicon will not effectively etch the lateral portions of silicon dioxide layer 17 at the surface, the etch-down step for the silicon pockets should be followed by the application of a conventional etchant for the silicon dioxide in order to etch-down the lateral silicon dioxide material and, thus restore planarity with silicon pockets 15.

Figure 2A:
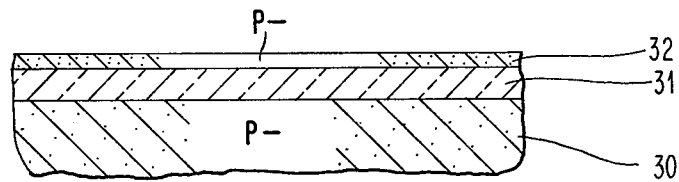
FIGS. 2A–2E show diagrammatic sectional views of a portion of an integrated circuit in order to illustrate an alternative embodiment of the method of the present invention.
Figure 2B:
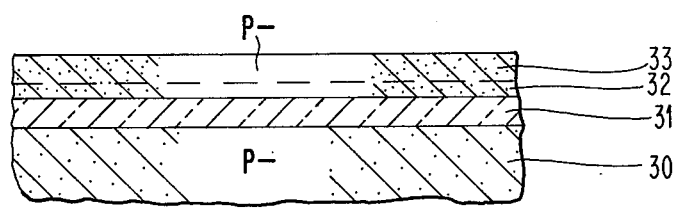

With reference to FIGS. 2A–2E, there will now be described an alternative embodiment of the method of the present invention. The structures of FIGS. 2A and 2B are essentially the same structure as that in FIGS. 1A and 1B, and are formed by substantially the same method. The structure comprises silicon substrate 30, subsurface silicon nitride layer 31, surface silicon substrate portion 32 and epitaxial layer 33.

Figure 2C:
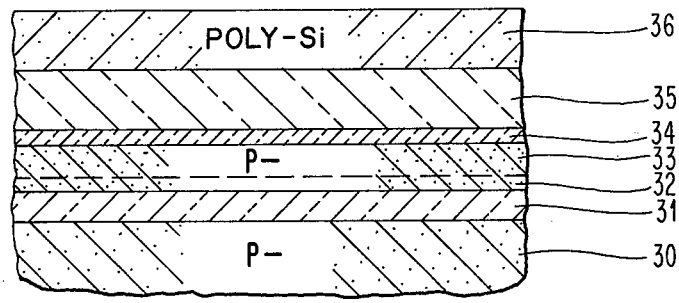

At this stage, instead of forming the lateral pattern of electrically insulative material as in FIG. 1C, it will be seen with reference to FIG. 2C, that a layer 34 of thermally grown silicon dioxide is formed using the same method as that used to form silicon dioxide layer 16 in FIG. 1C. Then, a layer of electrically insulative material 35 is formed by a process corresponding to that used to form electrically insulative layer 17 in FIG. 1B, after which supporting layer 36 of polycrystalline silicon is deposited utilizing the same chemical vapor deposition techniques previously described for the formation of polycrystalline silicon layer 18 in FIG. 1D.

Figure 2D:
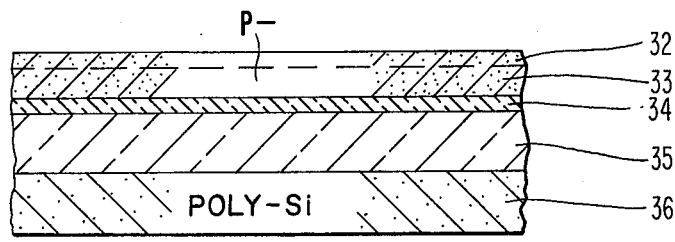

Next, with reference to FIG. 2D, silicon substrate 30 and subsurface silicon nitride layer 31 are removed utilizing the previously described techniques for removing substrate layer 10 and silicon nitride layer 11 (FIG. 1D) to produce the structure shown in FIG. 2D which has been inverted.

At this point, it may be desirable to remove the remaining surface portion of the original silicon substrate 32. This may be readily accomplished by subjecting the structure to a conventional etchant for silicon as set forth above for a time sufficient to remove layer 32 and to expose a planar surface comprising epitaxially deposited silicon layer 33.

Figure 2E:
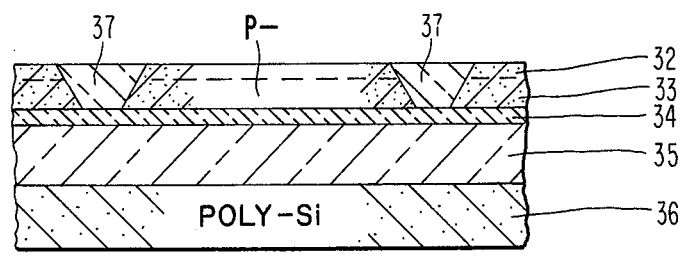

Finally, the lateral isolation step may be performed by forming a pattern of silicon dioxide regions 37 extending through epitaxial layer 33 into contact withh insulative silicon dioxide layer 34 as shown in FIG. 2E. This pattern of silicon dioxide regions 37 may be formed utilizing any of the above described etch and refill techniques or recessed silicon dioxide formation techniques. Then, the structure of FIG. 2E may be subjected to techniques described with respect to FIG. 1F to complete the surface electric insulation and to form the integrated circuit devices and contacts thereto.

While the invention has been particularly shown and described with reference to the preferred embodiments thereof, it will be understood by those skilled in the art that various changes in form and details may be made therein without departing from the spirit and scope of the invention.

What is claimed is:

1. A method of forming an electrically insulated integrated circuit comprising
    forming a subsurface electrically insulating layer in a monocrystalline semiconductor substrate by
        bombarding a surface of said substrate with ions of at least one element selected from the group consisting of nitrogen, oxygen, and carbon,
        maintaining the bombardment for a time sufficient to produce an ion concentration of at least $10^{19}$ ions/cm$^3$ and at an energy level sufficient to result in ion penetration to a selected depth, and
        heating the resultant bombarded substrate to a temperature sufficient to react the ions introduced by the bombardment with the substrate,
    epitaxially depositing a monocrystalline layer of the same semiconductor material as said substrate on said surface,
    forming a pattern of regions of electrically insulating material extending through said epitaxial monocrystalline layer and beyond said substrate surface into contact with said subsurface layer to laterally surround a plurality of pockets of said semiconductor material,
    forming an electrically insulative layer on the surface of said expitaxial layer continuous with said electrically insulating regions,
    removing said substrate below said subsurface layer to expose said subsurface layer, and
    etching away said subsurface layer.

2. The method of claim 1 wherein said subsurface layer is etched away with a solvent in which said subsurface layer is more etchable than said regions of electrically insulating material.

3. The method of claim 2 wherein said semiconductor substrate is a silicon substrate.

4. The method of claim 3 wherein said ions are nitrogen ions, and the resulting subsurface electrically insulating layer is, thus, a silicon nitride layer.

5. The method of claim 4 wherein said pattern of regions of electrically insulating material extending through the epitaxial layer are formed by first etching a pattern of apertures into the epitaxial layer and then forming said electrically insulating material in said apertures.

6. The method of claim 5 wherein said electrically insulating material formed in said apertures is silicon dioxide.

7. The method of claim 6 wherein said electrically insulative layer on the surface of said epitaxial layer is silicon dioxide.

8. The method of claim 7 further including the step of depositing a supporting layer of polycrystalline silicon on said silicon dioxide layer.

9. The method of claim 7 comprising the further step of selectively introducing conductivity-determining impurities into said planar surfaces of said semiconductor pockets to form regions in said pockets of different conductivity-type than that of the pockets.

10. The method of claim 9 including the further step of forming a layer of electrically insulative material covering the planar surfaces of said silicon pockets to provide an integrated circuit structure having complete isolation with electrically insulative material.

11. A method of forming an electrically insulated integrated circuit comprising
    forming a subsurface electrically insulating layer in a monocrystalline silicon substrate by
        bombarding a surface of said substrate with ions of at least one element selected from the group consisting of nitrogen, oxygen, and carbon,
        maintaining the bombardment for a time sufficient to produce an ion concentration of at least $10^{19}$ ions per cm$^3$ and at an energy level sufficient to result in ion penetration to a selected depth, and
        heating the resultant bombarded substrate to a temperature sufficient to react the ions introduced by the bombardment with the substrate,
    epitaxially depositing a monocrystalline layer of silicon on said surface,
    forming an electrically insulative layer on the surface of said epitaxial layer,
    etching away said silicon substrate below said subsurface layer to expose said subsurface layer,
    etching away said subsurface layer to expose a planar silicon surface, and
    forming a pattern of regions of electrically insulating material extending from said planar surface through said epitaxial silicon layer into contact with said electrically insulative layer.

12. The method of claim 11 wherein said ions are nitrogen ions, and the resulting subsurface electrically insulating layer is, thus, a silicon nitride layer.

13. The method of claim 12 wherein said pattern of regions of electrically insulating material extending through the epitaxial layer are formed by first etching a pattern of apertures into the epitaxial layer and then forming said electrically insulating material in said apertures.

14. The method of claim 13 wherein said electrically insulating material formed in said apertures is silicon dioxide.

15. The method of claim 14 wherein said electrically insulative layer on the surface of said epitaxial layer is silicon dioxide.

16. The method of claim 15 further including the step of depositing a supporting layer of polycrystalline silicon on said silicon dioxide layer.

17. The method of claim 16 comprising the further step of selectively introducing conductivity-determining impurities into said planar surfaces of said semiconductor pockets to form regions in said pockets of different conductivity-type than that of the pockets.

18. The method of claim 17 including the further step of forming a layer of electrically insulative material covering the planar surfaces of said silicon pockets to provide an integrated circuit structure having complete isolation with electrically insulative material.

19. The method of claim 11 including the further step, carried out subsequent to the etching away of said subsurface layer comprising etching said exposed planar silicon surface to a depth sufficient to remove the remaining portions of said silicon substrate to thereby expose said silicon epitaxial layer.

20. A method of forming an electrically insulated integrated circuit comprising forming a subsurface layer in a monocrystalline silicon substrate of a material having a different chemical etchability than silicon by bombarding a surface of said substrate with ion of an element which reacts with silicon to form said material, maintaining the bombardment for a time sufficient to produce an ion concentration of at least $10^{19}$ ions per $cm^3$ and at an energy level sufficient to result in ion penetration to a selected depth, and heating the resultant bombarded substrate to a temperature sufficient to react the ions introduced by the bombardment with the silicon, epitaxially depositing a monocrystalline silicon layer on said surface, forming a layer of silicon dioxide on said epitaxial silicon layer, depositing a supporting layer of polycrystalline silicon on said silicon dioxide layer, etching away said silicon substrate below said subsurface layer with a solvent in which silicon is more etchable than said material of the subsurface layer, and etching away said subsurface layer with a solvent in which the material of said subsurface layer is more etchable than is silicon to expose a planar silicon surface.

21. The method of claim 20 including the further step, carried out subsequent to the etching away of said subsurface layer comprising etching said exposed planar silicon surface to a depth sufficient to remove the remaining portions of said silicon substrate to thereby expose said silicon epitaxial layer.

* * * * *